US 6,738,959 B2

(12) United States Patent
Jung et al.

(10) Patent No.: US 6,738,959 B2
(45) Date of Patent: May 18, 2004

(54) METHOD AND APPARATUS FOR ASSIGNING NETS TO METAL LAYERS DURING CIRCUIT ROUTING

(75) Inventors: Dae Suk Jung, Santa Clara, CA (US); Seong Rai Cho, San Jose, CA (US); Yet-Ping Pai, Milpitas, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/211,632

(22) Filed: Aug. 2, 2002

(65) Prior Publication Data

US 2004/0025134 A1 Feb. 5, 2004

(51) Int. Cl.[7] ............................................. G06F 17/50
(52) U.S. Cl. .............................. 716/13; 716/14; 716/16; 716/17; 716/11
(58) Field of Search ........................ 716/13–17, 11–12

(56) References Cited

U.S. PATENT DOCUMENTS

| | | | | |
|---|---|---|---|---|
| 5,461,576 A | * | 10/1995 | Tsay et al. ..................... | 716/6 |
| 5,996,735 A | * | 12/1999 | Perritt et al. ................ | 182/115 |
| 6,043,677 A | * | 3/2000 | Albu et al. .................... | 326/39 |
| 6,286,128 B1 | * | 9/2001 | Pileggi et al. ................ | 716/18 |
| 6,557,145 B2 | * | 4/2003 | Boyle et al. ................... | 716/2 |

* cited by examiner

Primary Examiner—Matthew Smith
Assistant Examiner—Granville D. Lee, Jr.
(74) Attorney, Agent, or Firm—Park, Vaughan & Fleming LLP; Edward J. Grundler

(57) ABSTRACT

One embodiment of the present invention provides a system that facilitates routing nets between cells in a circuit layout. During operation, the system receives a circuit design to be routed, wherein the circuit design includes multiple circuit blocks that have been placed at specific locations within the circuit layout. Next, the system determines estimated lengths for nets that couple these circuit blocks together. The system then calculates the delay for the nets that couple the circuit blocks using a class one rule. If the delay in a given net is greater than a specified delay, the system inserts a virtual repeater into the given net to decrease the delay.

35 Claims, 3 Drawing Sheets

| CLASS RULES 126 | | | |
|---|---|---|---|
| | METAL LAYERS | WIDTH | SPACE |
| CLASS 1 | 1, 2, 3, 4 | 1 | 2 |
| CLASS 2 | 5, 6 | 2 | 2 |
| CLASS 3 | 7, 8 | 3 | 3 |

TABLE 1

METHOD AND APPARATUS FOR ASSIGNING NETS TO METAL LAYERS DURING CIRCUIT ROUTING

BACKGROUND

1. Field of the Invention

The present invention relates to the process of routing signals between circuit elements within an integrated circuit. More specifically, the present invention relates to a method and an apparatus for assigning nets that carry signals between circuit elements to specific metal layers during the process of routing of signals between circuit elements within an integrated circuit.

2. Related Art

Dramatic advances in integrated circuit technology presently make it possible to integrate hundreds of millions of transistors onto a single semiconductor chip. These dramatic advances are made possible by improvements in wafer processing technology and by automated design tools, which can handle the complexity involved in designing circuits with hundreds of millions of transistors.

These automated design tools operate by receiving a functional specification of an integrated circuit and then decomposing the functional specification into corresponding circuit elements. These circuit elements are then placed at specific locations on the semiconductor chip. During a subsequent routing operation, various nets are routed to form signal pathways between the circuit elements. A timing model can subsequently be used to calculate path delays through the nets to verify that the circuit meets timing constraints. These path delays can be adjusted, if necessary, by assigning nets to metal layers with different delay characteristics. Also, flip-flops can be inserted into nets that do not meet minimum timing requirements. Since inserting flip-flops changes the logic of the circuit, a design engineer typically performs this step manually before repeating the placement and routing operations.

One routing technique operates by assigning nets to groups associated with specific metal layers according to an engineer's estimate of the speed of particular nets. However, this technique is not ideal because it requires the engineer to manually assign nets to metal layers on an ad hoc basis, without providing the engineer with a clear set of alignment rules.

Hence, what is needed is a method and an apparatus for assigning nets to specific metal layers during the process of routing of signals between circuit elements without the drawbacks described above.

SUMMARY

One embodiment of the present invention provides a system that facilitates routing nets between cells in a circuit layout. During operation, the system receives a circuit design to be routed, wherein the circuit design includes multiple circuit blocks that have been placed at specific locations within the circuit layout. Next, the system determines estimated lengths for nets that couple these circuit blocks together. The system then calculates the delay for the nets that couple the circuit blocks using a class one rule. If the delay in a given net is greater than a specified delay, the system inserts a virtual repeater into the given net to decrease the delay.

In a variation of this embodiment, determining estimated lengths for nets involves computing a Steiner tree.

In a further variation, determining the estimated lengths for the nets involves assigning nets to layers.

In a further variation, the class one rule assigns the given net to a first through fourth metal layer.

In a further variation, if the delay is less than one clock cycle, the system assigns the given net to a first group.

In a further variation, if the delay is not less than one clock cycle the system calculates the delay for the nets using a class two rule, and if the delay in the given net is greater than a specified delay, the system inserts a virtual repeater in the given net to decrease the delay.

In a further variation, the class two rule assigns the given net to a fifth through sixth metal layer.

In a further variation, if the delay is less than one clock cycle, the system assigns the given net to a second group.

In a further variation, if the delay is not less than one clock cycle the system calculates the delay for nets using a class three rule and if the delay in the given net is greater than a specified delay, the system inserts a virtual repeater in the given net to decrease the delay.

In a further variation, the class three rule assigns the given net to a seventh through eighth metal layer.

In a further variation, if the delay is less than one clock cycle, the system assigns the given net to a third group.

In a further variation, the system reports the first group, the second group, and the third group to provide a starting assignment for a subsequent routing process.

In a further variation, if the delay is not less than one clock cycle, the system inserts a virtual flip-flop in the given net, and changes the delay criterion from greater than one clock cycle to greater than two clock cycles. The system then repeats the process.

TABLE 1 is a table of class rules in accordance with an embodiment of the present invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Computer System

Figure 1A:
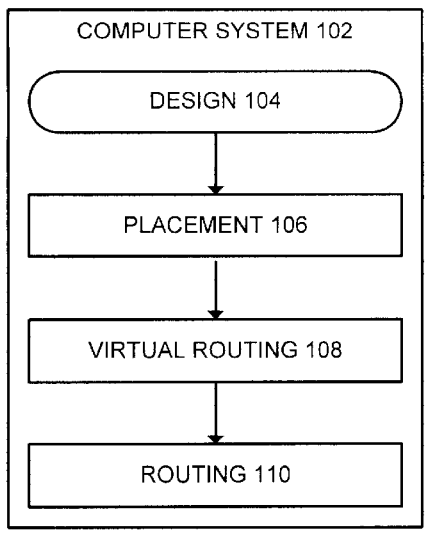
FIG. 1A illustrates a computer system 102 in accordance with an embodiment of the present invention.

FIG. 1A illustrates a computer system 102 in accordance with an embodiment of the present invention. Computer system 102 includes design 104, placement 106, virtual routing 108, and routing 110.

Computer system 102 receives design 104 and routes design 104 to placement 106 for placement of the circuit blocks included in the design. Note that the terms "circuit blocks", "cells", and "circuit elements" are used interchangeably in this document and generally refer to circuit components, which are placed on a substrate and coupled together with metal to form the completed circuit.

After placement 106 places the blocks, the placement is passed to virtual routing 108 for routing the interconnections nets between the various circuit elements. Finally, the virtual routing is passed to routing 110 to finish the routing based upon the virtual routing.

Figure 1B:
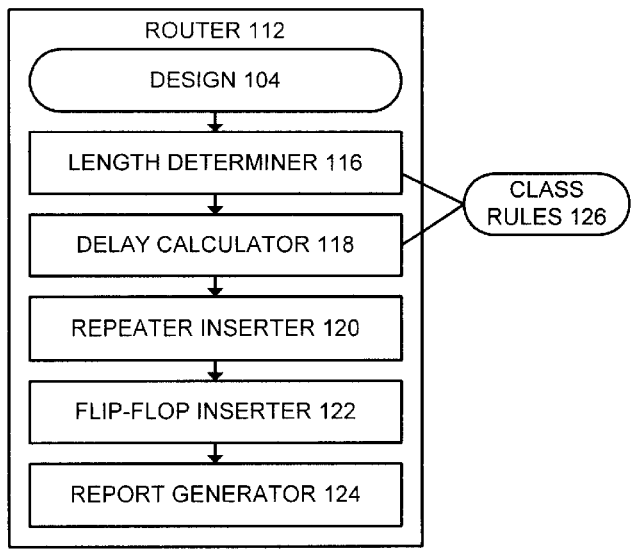
FIG. 1B illustrates a router 112 in accordance with an embodiment of the present invention.

FIG. 1B illustrates a router 112 in accordance with an embodiment of the present invention. Router 112 includes design 104, length determiner 116, delay calculator 118, repeater inserter 120, flip-flop inserter 122, and report generator 124. Length determiner 116 and delay calculator 118 receive input from class rules 126, which includes resistance/capacitance (RC) information for each metal type, width, and spacing and layer assignments as described below in conjunction with Table 1.

Length determiner 116 determines the length of the nets within design 104, which couple the cells for example by using a Steiner tree or Manhattan distance technique. These are well-known techniques in the art for determining net lengths and will not be discussed further herein.

Figure 3:
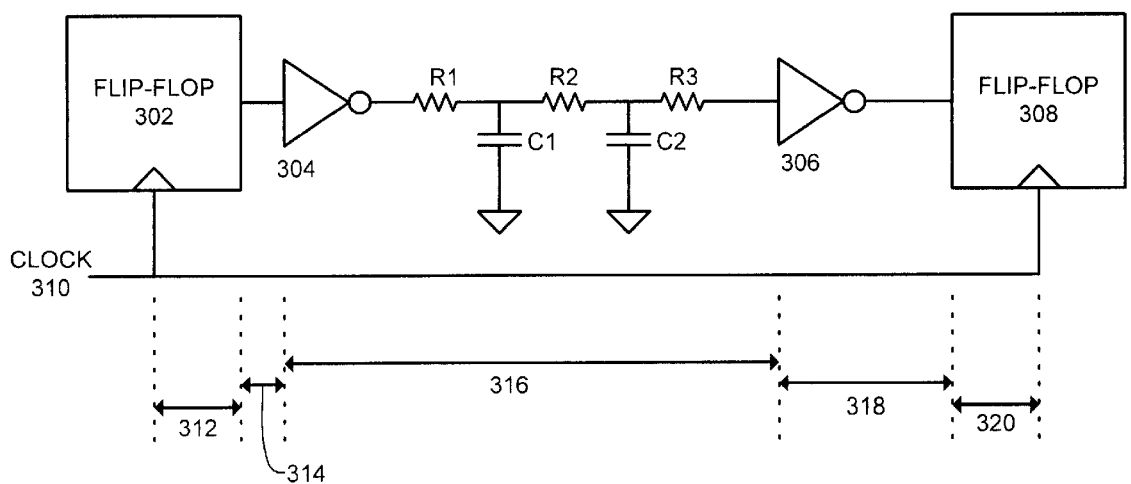
FIG. 3 illustrates total path delay in accordance with an embodiment of the present invention.

Next, delay calculator 118 determines the delay for the various nets. If the maximum allowed delay is reached for a specific net, repeater inserter 120 inserts a repeater in the net to reduce the delay time. If the maximum allowed delay is still exceeded, the system uses higher levels of class rules. Higher levels of class rules provide shorter delays because of the increased metal widths and increased spacing on these layers. Details of the total path delay model are shown in FIG. 3.

If the delay for a given net cannot be brought below the maximum allowed delay by inserting repeaters and using higher class rules, flip-flop inserter 122 inserts a flip-flop into the given net, sets the delay criterion from greater than one clock cycle to greater than two clock cycles and repeats the process of calculating net delays, inserting inverters, and using different class rules to determine a net routing, which will meet the specified maximum allowed delay.

Report generator 124 generates a report, which includes the net groupings according to class, the inserted repeaters, and the inserted flip-flops. This report provides the input to a subsequent routing process.

Net Routing

Figure 2:
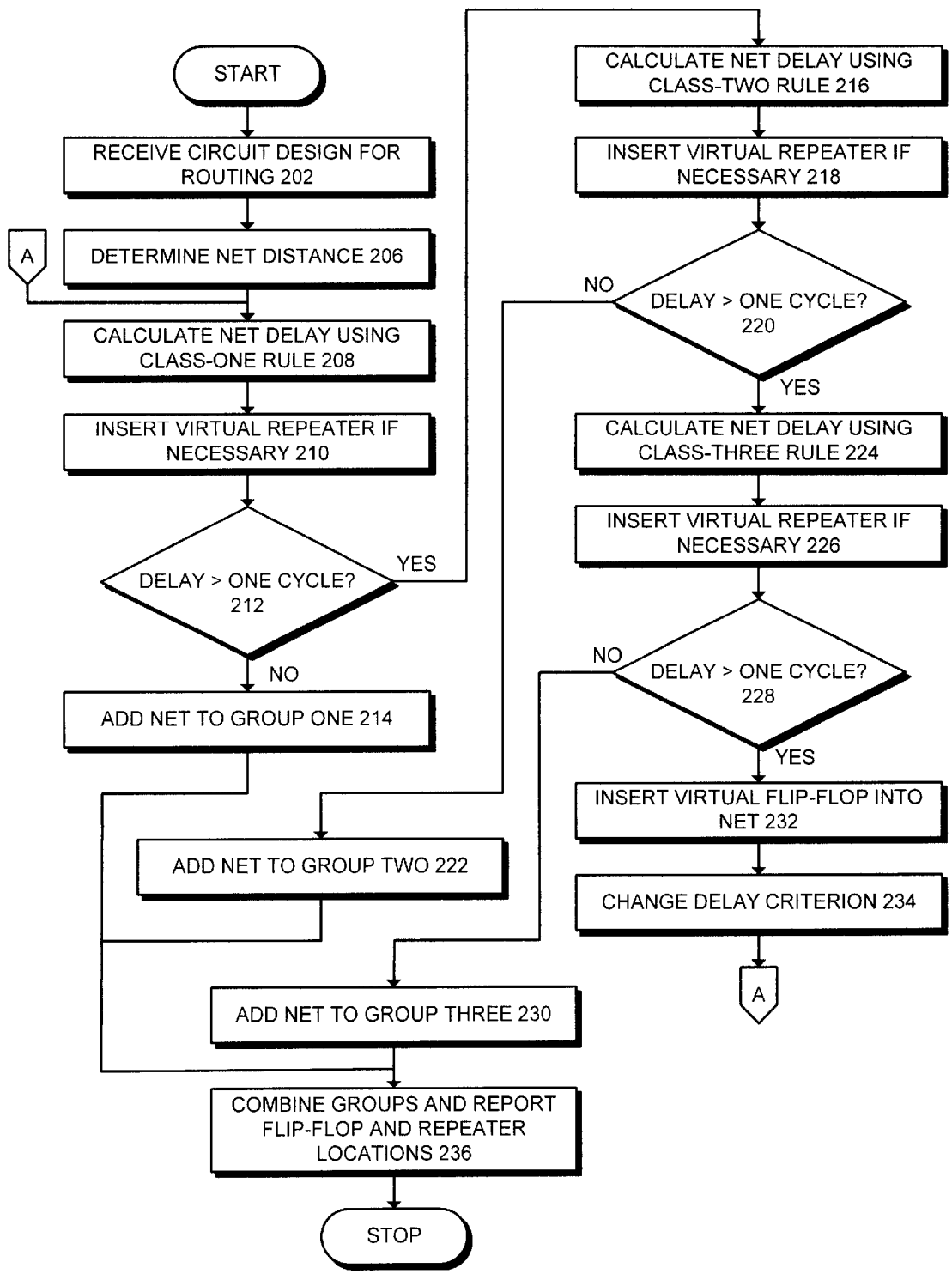
FIG. 2 is a flowchart illustrating the process of routing nets in a circuit design in accordance with an embodiment of the present invention.

FIG. 2 is a flowchart illustrating the process of producing a virtual routing for nets in a circuit design in accordance with an embodiment of the present invention. The system first receives a circuit design 104 for routing (step 202). This circuit design includes a placement for the cells, which comprise the circuit. Next, length determiner 116 determines the length of the nets, which couple the cells for example by using a Steiner tree or Manhattan distance technique (step 206).

Delay calculator 118 then calculates the delay for each net using the class-one rule (step 208). If necessary, repeater inserter 120 inserts a virtual repeater into the net to improve timing (step 210). The system then determines if the delay is greater than one clock cycle (step 212). If not, the net is added to group one (step 214).

If the delay is greater than one clock cycle, delay calculator 118 calculates the delay for each net using the class-two rule (step 216). If necessary, repeater inserter 120 inserts a virtual repeater into the net to improve timing (step 218). The system then determines if the delay is greater than one clock cycle (step 220). If not, the net is added to group two (step 222).

If the delay is greater than one clock cycle, delay calculator 118 calculates the delay for each net using the class-three rule (step 224). If necessary, repeater inserter 120 inserts a virtual repeater into the net to improve timing (step 226). The system then determines if the delay is greater than one clock cycle (step 228). If not, the net is added to group three (step 230).

If the delay is still greater than one clock cycle, flip-flop inserter inserts a virtual flip-flop into the net (step 232). The system then changes the delay criterion from greater than one clock cycle to greater than two clock cycles (step 234) and then returns to step 208 to repeat the process.

When the nets have been assigned to group one, group two, or group three, report generator 124 reports the results as a starting point for a subsequent routing step (step 236).

Total Path Delay

FIG. 3 illustrates a total path delay model in accordance with an embodiment of the present invention. Flip-flops 302 and 308 are coupled together by a net, which includes repeaters 304 and 306, resistors R1–R3, and capacitors C1 and C2. Repeaters 304 and 306 may have been inserted by repeater inserter 120. R1–R3 and C1–C2 are lumped values of resistance and capacitance representing the distributed resistance and capacitance on the metal layers that couple repeaters 304 and 306. Clock 310 is coupled to flip-flops 302 and 308 and provides timing signals to these flip-flops.

The total path delay includes delays 312, 314, 316, 318, and 320. Delay 312 is the clock to output delay time of flip-flop 302. Delays 314, 316, and 318 are the delays for the respective portions of the net coupling flip-flops 302 and 308. Delay 320 is the setup time for flip-flop 308. The total path delay is adjusted by inserting repeaters into the net, inserting flip-flops into the net, and/or by assigning the net to different class groups. Assigning the net to different class groups effectively changes the values of R1–R3 and C1 and C2, thereby changing the delay value.

Class Rule Table

Table 1 is a table of class rules in accordance with an embodiment of the present invention. In general, class rules 126 relate metal layers, width, and spacing for the metal. Specifically, class one includes metal layers 1–4 with width equal to one unit and spacing equal to two units; class two includes metal layers 5 and 6 with width equal to two units and spacing equal to two units; and class three includes metal layers 7 and 8 with width equal to three units and spacing equal to three units. Other combinations are equally acceptable for a given layer.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for routing nets between cells in a circuit layout, comprising:

receiving a circuit design for circuit routing, wherein the circuit design includes a plurality of circuit blocks that have been placed at specific locations in the circuit layout;

determining estimated lengths for nets coupling the plurality of circuit blocks;

calculating a delay for nets coupling the plurality of circuit blocks using a class one rule, wherein the class one rule assigns the given net to a first through fourth metal layer; and if the delay in a given net is greater than a specified delay, inserting a virtual repeater in the given net to decrease the delay.

2. The method of claim 1, wherein determining estimated lengths for nets coupling the plurality of circuit blocks involves computing a Steiner tree.

3. The method of claim 1, wherein determining estimated lengths for nets involves assigning nets to metal layers.

4. The method of claim 1, wherein if the delay is less than one cycle of a clock, the method further comprises assigning the given net to a first group.

5. The method of claim 4, wherein if the delay is not less than one clock cycle the method further comprises:

calculating the delay for nets coupling the plurality of circuit blocks using a class two rule; and if the delay in the given net is greater than the specified delay, inserting the virtual repeater in the given net to decrease the delay.

6. The method of claim 5, wherein the class two rule assigns the given net to a fifth through sixth metal layer.

7. The method of claim 5, wherein if the delay is less than one clock cycle, the method further comprises assigning the given net to a second group.

8. The method of claim 7, wherein if the delay is not less than one clock cycle the method further comprises:

calculating the delay for nets coupling the plurality of circuit blocks using a class three rule; and if the delay in the given net is greater than the specified delay, inserting the virtual repeater in the given net to decrease the delay.

9. The method of claim 8, wherein the class three rule assigns the given net to a seventh through eighth metal layer.

10. The method of claim 8, wherein if the delay is less than one clock cycle, the method further comprises assigning the given net to a third group.

11. The method of claim 10, further comprising reporting the first group, the second group, and the third group, whereby reporting these groups provides a starting assignment of nets to metal layers for a subsequent routing process.

12. The method of claim 8, wherein if the delay is not less than one clock cycle, the method further comprises:

inserting a virtual flip-flop in the given net;

changing a delay criterion from greater than one clock cycle to greater than two clock cycles; and repeating the method from calculating the delay for nets coupling the plurality of circuit blocks using the class one rule.

13. A computer-readable storage medium storing instructions that when executed by a computer cause the computer to perform a method for routing nets between cells in a circuit layout, comprising:

receiving a circuit design for circuit routing, wherein the circuit design includes a plurality of circuit blocks that have been placed at specific locations in the circuit layout;

determining estimated lengths for nets coupling the plurality of circuit blocks;

calculating a delay for nets coupling the plurality of circuit blocks using a class one rule, wherein the class one rule assigns the given net to a first through fourth metal layer; and if the delay in a given net is greater than a specified delay, inserting a virtual repeater in the given net to decrease the delay.

14. The computer-readable storage medium of claim 13, wherein determining estimated lengths for nets coupling the plurality of circuit blocks involves computing a Steiner tree.

15. The computer-readable storage medium of claim 13, wherein determining the estimated length for the nets involves assigning the nets to metal layers.

16. The computer-readable storage medium of claim 13, wherein if the delay is less than one cycle of a clock, the method further comprises assigning the given net to a first group.

17. The computer-readable storage medium of claim 16, wherein if the delay is not less than one clock cycle the method further comprises:

calculating the delay for nets coupling the plurality of circuit blocks using a class two rule; and if the delay in the given net is greater than the specified delay, inserting the virtual repeater in the given net to decrease the delay.

18. The computer-readable storage medium of claim 17, wherein the class two rule assigns the given net to a fifth through sixth metal layer.

19. The computer-readable storage medium of claim 17, wherein if the delay is less than one clock cycle, the method further comprises assigning the given net to a second group.

20. The computer-readable storage medium of claim 19, wherein if the delay is not less than one clock cycle the method further comprises:

calculating the delay for nets coupling the plurality of circuit blocks using a class three rule; and if the delay in the given net is greater than the specified delay, inserting the virtual repeater in the given net to decrease the delay.

21. The computer-readable storage medium of claim 20, wherein the class three rule assigns the given net to a seventh through eighth metal layer.

22. The computer-readable storage medium of claim 20, wherein if the delay is less than one clock cycle, the method further comprises assigning the given net to a third group.

23. The computer-readable storage medium of claim 22, further comprising reporting the first group, the second group, and the third group, whereby reporting these groups provides a starting assignment of nets to metal layers for a subsequent routing process.

24. The computer-readable storage medium of claim 20, wherein if the delay is not less than one clock cycle, the method further comprises:

inserting a virtual flip-flop in the given net;

changing a delay criterion from greater than one clock cycle to greater than two clock cycles; and repeating the method from calculating the delay for nets coupling the plurality of circuit blocks using the class one rule.

25. An apparatus for routing nets between cells in a circuit layout, comprising:
- a receiving mechanism that is configured to receive a circuit design for circuit routing, wherein the circuit design includes a plurality of circuit blocks that have been placed at specific locations in the circuit layout;
- a determining mechanism that is configured to determine estimated lengths for nets coupling the plurality of circuit blocks;
- a calculating mechanism that is configured to calculate a delay for nets coupling the plurality of circuit blocks using a class one rule, wherein the class one rule assigns the given net to a first through fourth metal layer; and
- an inserting mechanism that is configured to insert a virtual repeater in a given net to decrease the delay.

26. The apparatus of claim 25, wherein determining estimated lengths for nets coupling the plurality of circuit blocks involves computing a Steiner tree.

27. The apparatus of claim 25, wherein determining estimated lengths for the nets involves assigning nets to layers.

28. The apparatus of claim 25, further comprising an assigning mechanism that is configured to assign the given net to a first group.

29. The apparatus of claim 28, wherein:
- the calculating mechanism is further configured to calculate the delay for nets coupling the plurality of circuit blocks using a class two rule; and
- the inserting mechanism is further configured to insert the virtual repeater in the given net to decrease the delay.

30. The apparatus of claim 29, wherein the class two rule assigns the given net to a fifth through sixth metal layer.

31. The apparatus of claim 29, wherein the assigning mechanism is further configured to assign the given net to a second group.

32. The apparatus of claim 31, wherein:
- the calculating mechanism is further configured to calculate the delay for nets coupling the plurality of circuit blocks using a class three rule; and
- the inserting mechanism is further configured to insert the virtual repeater in the given net to decrease the delay.

33. The apparatus of claim 32, wherein the class three rule assigns the given net to a seventh through eighth metal layer.

34. The apparatus of claim 32, wherein the assigning mechanism is further configured to assign the given net to a third group.

35. The apparatus of claim 34, further comprising a reporting mechanism that is configured to report the first group, the second group, and the third group, whereby reporting these groups provides a starting assignment of nets to metal layers for a subsequent routing process.

* * * * *